United States Patent
Metaxakis

(10) Patent No.: US 7,075,377 B2
(45) Date of Patent: Jul. 11, 2006

(54) QUADRATURE VOLTAGE CONTROLLED OSCILLATORS WITH PHASE SHIFT DETECTOR

(75) Inventor: Emmanuel Metaxakis, Athens (GR)

(73) Assignee: Theta Microeletronics, Inc., San Jose, CA (US)

( * ) Notice: Subject to any disclaimer, the term of this patent is extended or adjusted under 35 U.S.C. 154(b) by 0 days.

(21) Appl. No.: 10/864,969

(22) Filed: Jun. 10, 2004

(65) Prior Publication Data

US 2005/0275469 A1    Dec. 15, 2005

(51) Int. Cl.
H03B 5/12    (2006.01)
(52) U.S. Cl. .................. 331/46; 331/117 R; 331/16
(58) Field of Classification Search .............. 331/46, 331/172, 177 R, 117 R, 36 C, 48, 50
See application file for complete search history.

(56) References Cited

U.S. PATENT DOCUMENTS

| | | | |
|---|---|---|---|
| 4,947,141 A | 8/1990 | Atkinson et al. | |
| 5,438,301 A | 8/1995 | Havens et al. | |
| 5,629,652 A | 5/1997 | Weiss | |
| 5,949,821 A | 9/1999 | Emami et al. | |
| 6,044,112 A | 3/2000 | Koslov | |
| 6,198,777 B1 | 3/2001 | Feher | |
| 6,229,406 B1* | 5/2001 | Wang | 331/117 FE |
| 6,249,190 B1 | 6/2001 | Rozenblit et al. | |
| 6,307,894 B1 | 10/2001 | Eidson et al. | |
| 6,429,748 B1* | 8/2002 | Nicholls et al. | 331/56 |
| 6,445,749 B1 | 9/2002 | Feher | |
| 6,456,167 B1 | 9/2002 | Huang | |
| 6,462,626 B1* | 10/2002 | Gharpurey | 331/108 B |
| 6,560,448 B1 | 5/2003 | Baldwin et al. | |
| 6,650,195 B1 | 11/2003 | Brunn et al. | |
| 6,687,314 B1 | 2/2004 | Leonard et al. | |
| 6,694,129 B1 | 2/2004 | Peterzell et al. | |
| 6,696,899 B1 | 2/2004 | Ruffieux | |
| 6,707,344 B1 | 3/2004 | Cargill et al. | |
| 6,735,426 B1 | 5/2004 | Pau | |
| 6,750,727 B1* | 6/2004 | Sutardja | 331/117 R |
| 6,870,432 B1* | 3/2005 | Li et al. | 331/46 |
| 6,906,596 B1* | 6/2005 | Kitamura et al. | 331/36 C |
| 2002/0008590 A1 | 1/2002 | Van Der Tang et al. | |
| 2002/0039052 A1 | 4/2002 | Straub et al. | |
| 2003/0076186 A1 | 4/2003 | Ichimaru | |
| 2003/0139167 A1 | 7/2003 | Ciccarelli et al. | |
| 2003/0189467 A1 | 10/2003 | Krawczyk, Jr. et al. | |
| 2003/0220086 A1 | 11/2003 | Birkett | |
| 2004/0005869 A1 | 1/2004 | See et al. | |
| 2004/0092241 A1 | 5/2004 | Kim et al. | |

* cited by examiner

*Primary Examiner*—Dinh T. Le
(74) *Attorney, Agent, or Firm*—Blakely, Sokoloff, Taylor & Zafman LLP

(57) ABSTRACT

In wireless application there is made use of a quadrature oscillators that generate signals that are capable of oscillating at quadrature of each other. The quadrature oscillator is comprised of two differential modified Colpitts oscillators. A capacitor bank allows for the selection of a desired frequency from a plurality of discrete possible frequencies. The quadrature oscillator is further coupled with a phase-error detector connected at the point-of-use of the generated 'I' and 'Q' channels and through the control of current sources provides corrections means to ensure that the phase shift at the point-of-use remains at the desired ninety degrees.

16 Claims, 6 Drawing Sheets

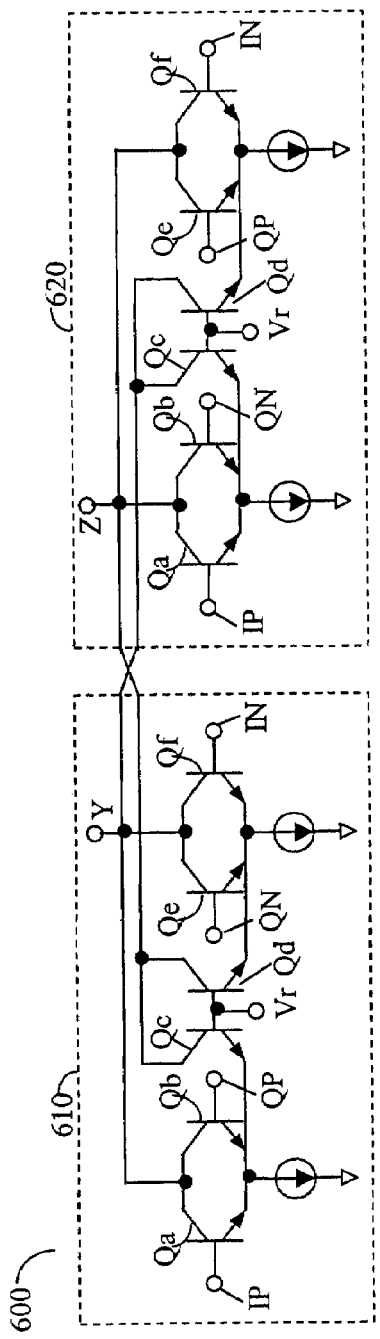

FIGURE 6

| | Y Group | Z Group |
|---|---|---|
| Qc | $I_{cQc} = \dfrac{d}{d + \exp(-v_1/V_T) + \exp(v_2/V_T)} I_{BIAS}$ | $I_{cQc} = \dfrac{d}{d + \exp(v_1/V_T) + \exp(-v_2/V_T)} I_{BIAS}$ |
| Qd | $I_{cQe} = \dfrac{d}{d + \exp(-v_1/V_T) + \exp(v_2/V_T)} I_{BIAS}$ | $I_{cQc} = \dfrac{d}{d + \exp(-v_1/V_T) + \exp(v_2/V_T)} I_{BIAS}$ |
| Qa+Qb | $I_{cQc,Qb} = \dfrac{\exp(v_1/V_T)}{d + \exp(v_1/V_T) + \exp(-v_2/V_T)} I_{BIAS}$ | $I_{cQe,Qf} = \dfrac{\exp(-v_1/V_T)}{d + \exp(-v_1/V_T) + \exp(v_2/V_T)} I_{BIAS}$ |
| Qe+Qf | $I_{cQe,Qf} = \dfrac{\exp(-v_1/V_T)}{d + \exp(-v_1/V_T) + \exp(v_2/V_T)} I_{BIAS}$ | $I_{cQe,Qf} = \dfrac{\exp(v_1/V_T)}{d + \exp(v_1/V_T) + \exp(-v_2/V_T)} I_{BIAS}$ |

QUADRATURE VOLTAGE CONTROLLED OSCILLATORS WITH PHASE SHIFT DETECTOR

BACKGROUND OF THE INVENTION

1. Field of the Invention

The present invention relates generally to quadrature voltage controlled oscillators (VCOs), and more specifically to quadrature VCOs covering a wide frequency range and compensating for far-end phase errors.

2. Prior Art

Over the last few years, there has been significant expansion in the need for wireless local area networks (WLAN). Traditionally, network connectivity was provided through wires running through the walls, floors or ceilings of the area requiring network connectivity. Such connectivity provides certain advantages, but also has certain limitations, such as the need to place physical cables and the need to replace cables as modifications in the networks are required, just to name a few. Therefore WLANs (wireless local area networks) are becoming increasingly attractive for use, as radio frequencies (RF) have the ability, although limited at times, to overcome physical obstacles and allow for a significantly more flexible design of local networks.

While WLAN has its very well recognized advantages, it also suffers from problems common to high frequency wireless technologies. Physical obstacles can reduce the quality of service (QoS) to below desired levels, due to obstruction, reflection, noise, and other dynamic characteristics of the environment in which the WLAN system operates. In many cases, the environment in which the WLAN operates is constantly changing, and requires that the WLAN adapts to these changes and continues to provide a desired level of QoS.

Due to the limitations of the environment in which WLAN operates, it is necessary that the system functions in a manner that provides the best performance possible, i.e., provides the ability to transfer the maximum data possible, or in other words, provide the highest possible bandwidth on both the receiving and transmitting ends.

The data is superimposed on an RF signal, using for example orthogonal frequency division multiplexing (OFDM) as the modulation technique. The RF modulation involves modulation of both the amplitude and the phase angle. Phase modulation and demodulation is achieved by, for example, the use of a pair of mixers that utilize a quadrature local oscillator (LO). The quadrature oscillator provides an in-phase signal 'I' and a quadrature phase 'Q', both being in the same frequency. However, the 'Q' signal is delayed by 90 degrees with respect of the 'I' signal. It is well-known in the art that the more accurate the 90 degree shift between the 'I' and 'Q' signals, the greater the amount of data that can be sent on the carrier signal.

It is further noteworthy that the phase error may occur at a distance from the generation of the 'I' and 'Q' signals. This happens due to the high frequencies used in WLAN, over 1 GHz, and therefore, while the 'I' and 'Q' signal may be sufficiently accurate at the generation point, they may still be insufficiently accurate at the point-of-use. If it is desired to achieve a high data rate, it is essential that the phase error not exceed a few degrees of error from the desired 90 degree level.

It is therefore important to design the circuits in a way that will reduce the level of error, and preferably be self-correcting. It would be further desirable that the system be able to generate the 'I' and 'Q' signals such that at the point-of-use, the accuracy will be the highest. It would be further preferable if the solution provided be insensitive to manufacturing process variations and tolerances of integrated components so as to ensure the operation of the quadrature VCO within the requirements for high performance.

BRIEF DESCRIPTION OF THE DRAWINGS

FIG. 6 is a diagram of a differential quadrature phase-error detector in accordance with the disclosed invention.

FIG. 7 is a table showing the collector currents of the differential quadrature phase-error detector

DETAILED DESCRIPTION OF THE PREFERRED EMBODIMENTS

The present inventors have noted that it is necessary to overcome the deficiencies of prior art solutions for the implementation of a quadrature voltage controlled oscillator (VCO), particularly for the purpose of addressing the requirements of wireless local area network (WLAN) standards such as IEEE 802.11a, HiperLan-2, and the Japanese HisWAN. In accordance with the disclosed invention, a modified Colpitts oscillator operative in a differential mode is implemented. It is further necessary that the VCO covers a range of 1.6 GHz in sixteen overlapping bands, keeping the tuning sensitivity low to accommodate for process variation. Furthermore, switching is performed automatically by monitoring the varactor tuning voltage. It is still further necessary to ensure that there is a compensation for phase shift of the 'I' and 'Q' channels in order to ensure a ninety degree shift between the signals at the point-of-use, rather than the point of generation. By applying an innovative phase-error detector at the point-of-use of the 'I' and 'Q' channels, it is possible to ensure that the signal from the quadrature VCO at the point of generation is such that at the point-of-use, the appropriate shift between the signals is maintained.

Figure 1:
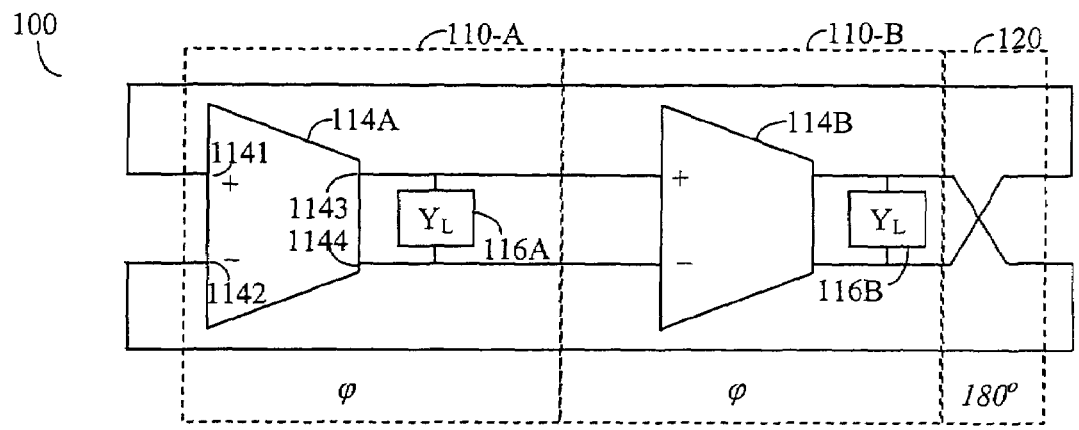
FIG. 1 is a block-diagram of a quadrature VCO in accordance with the disclosed invention.

Now referring to FIG. 1, a block-diagram of an exemplary quadrature VCO 100 in accordance with the present invention may be seen. Quadrature VCO 100 comprises of two identical oscillators 110-A and 110-B. It is important to preferably design these oscillators, when implemented as integrated components on an integrated circuit (IC), to be as close to identical as reasonably possible. Preferably this means designing the transistors to have identical bias, and other components to have an identical layout. The more alike these oscillators are, the better the operation of quadrature VCO 100 will be regarding the phase matching.

An oscillator 110 is comprised of a differential transconducting amplifier 114 and a load 116. Load 116 is generally comprised of a capacitor 116C and a resistor 116R as shown in the quadrature oscillator model of FIG. 4, subsequently described. Essentially, oscillators 110 are modified Colpitts inductor-capacitor (LC) oscillators with coupling inputs, details of which shall be subsequently provided. Another component of quadrature VCO 100 is a cross-coupler 120, that feeds back the output of the second differential transconducting amplifier 114-B to the first differential transconducting amplifier 114-A, but crosses the outputs. The condition for stable oscillation at a fixed frequency is that the phase at the output be zero degrees and that the gain of the system be larger than unity. Cross-coupler 120 provides 180 degrees of phase shift due to the cross-over function, which function is hard wired and therefore quite precise (not introducing phase shift other than the intended 180 degrees). Since oscillators 110 are designed to be identical, their outputs will each be rotated by ω degrees with respect to its input. As cross-coupler 120 provide 180 degrees, the two oscillators 114-A and 114-B provide together an additional rotation of 180 degrees. As noted above, because differential transconducting amplifier 114 and loads 116 are essentially identical, their phase shifts will also nominally be identical, namely 90 degrees. Thus the outputs of the two oscillators are 90 degrees apart. Therefore the design provides a quadrature VCO where the output from differential transconducting amplifier 114-A provides a first set of signals and the output from differential transconducting amplifier 114-B provides a second set of signals shifted 90 degrees from the first set of signals.

Figure 2:
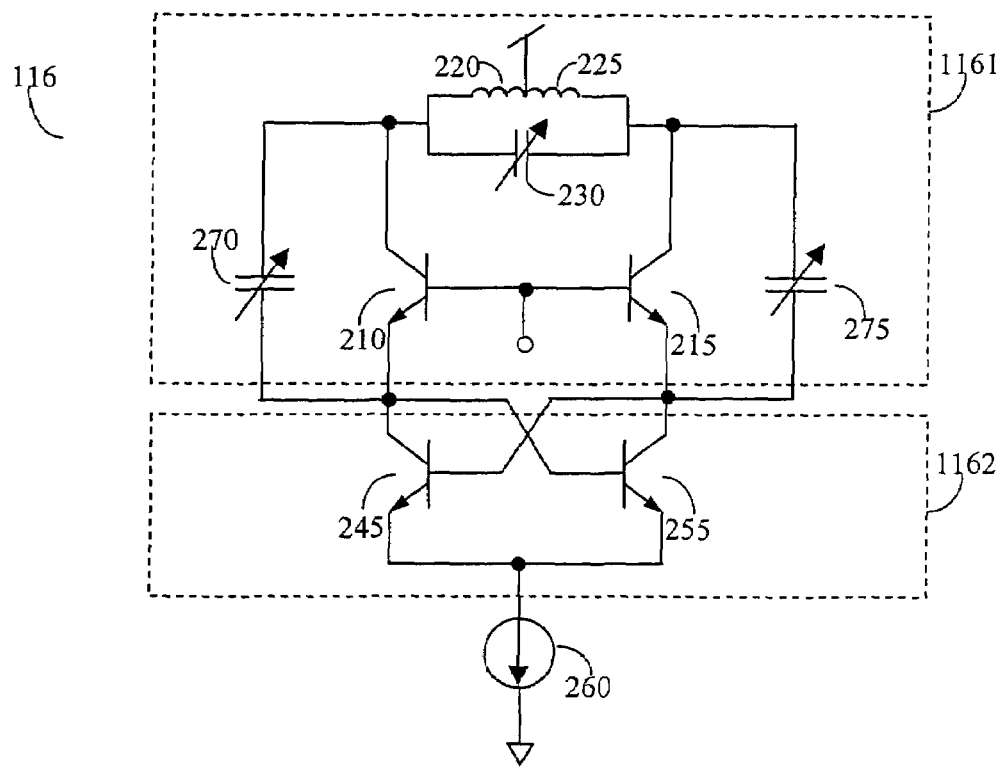
FIG. 2 is a schematic diagram of a modified differential Colpitts oscillator building block.
Figure 3:
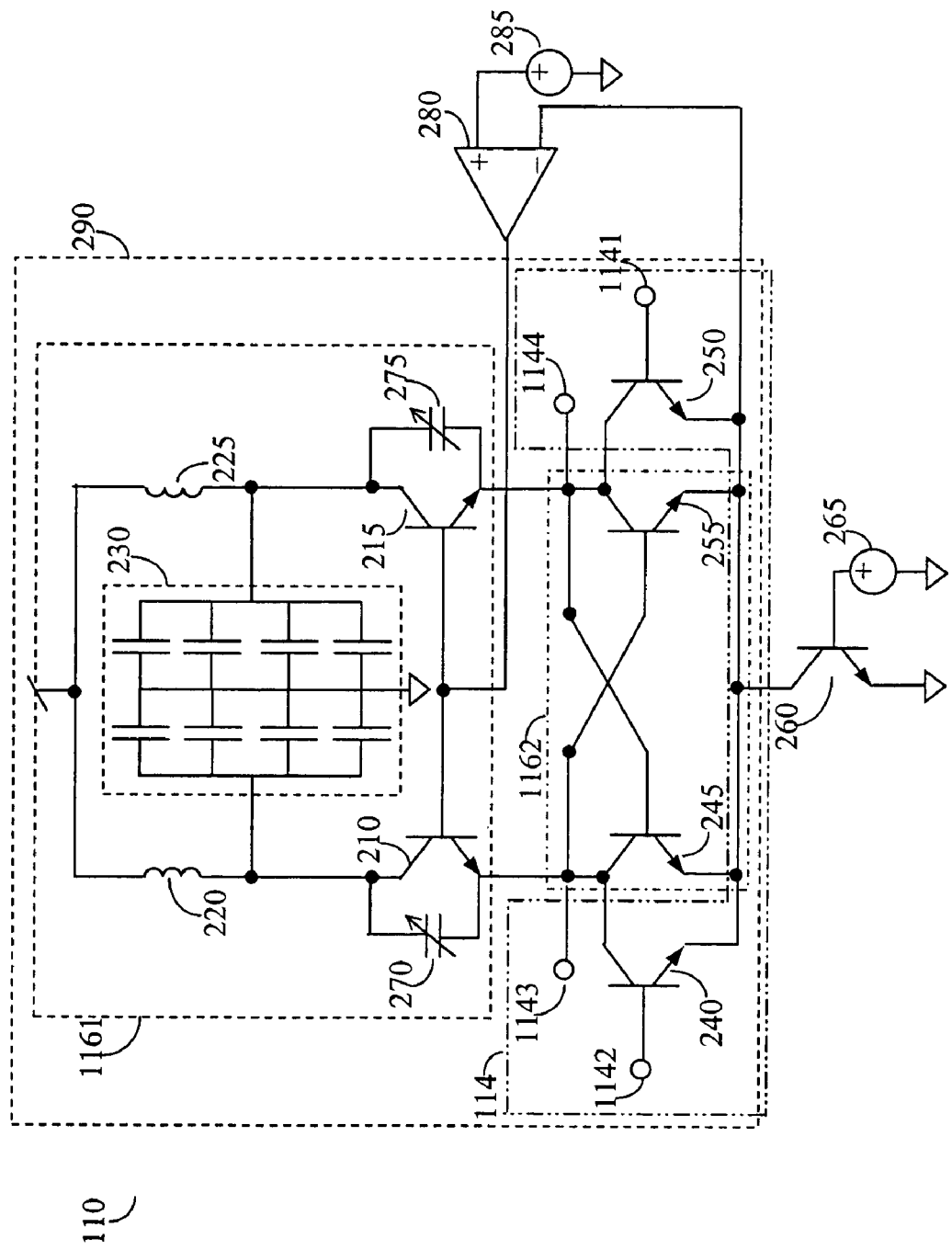
FIG. 3 is a schematic diagram of one stage of the quadrature VCO using the modified differential Colpitts oscillator building block.

A single stage modified differential Colpitts oscillator is shown in FIG. 2, and may used as a building block for the implementation of a quadrature VCO 100. The building block is further modified as shown in FIG. 3 for the purposes of connecting to a second oscillator 110-B, as shown in FIG. 1. The operation of the oscillator, for example oscillator 110-A, comprised of a modified differential Colpitts oscillator 1161 and its circuits 114 and 1162 for operation in quadrature VCO 100 is explained in more detail with specific reference to FIG. 3, where a schematic diagram of one stage 110 (FIG. 1) of the quadrature VCO 100 is shown. One or more capacitors 230, schematically shown for clarity, are selectively connected in parallel to inductive loads 220 and 225 that are further connected to the collectors of the common base differential pair of transistors 210 and 215, and further providing a differential mode of operation. Inductors 220 and 225 are connected to common base transistors 210 and 215 respectively, and have a typical value of 1.1 nH for 5 GHz operation. A capacitor bank 230 allows for the creation of multiple frequencies of operation as may be desired to cover the required range, typically in the range of 300–700 fF for 5 GHz operation. A cross-coupled differential pair 245 and 255 ensures the startup of the oscillation and prevents from common mode oscillations. When the signal at the output is low, as typical in oscillator startup, the cross-coupled pair 245 and 255 act as a negative resistance, helping the circuit to reach steady state faster. At large output signal levels, the transistor pair 245 and 255 act as current switches and steer the bias current, supplied by current source 260, for half of the oscillation period toward-transistor 210 and for the other half, toward transistor 215. Consequently the differential architecture does not require twice as much current compared to a single ended implementation used in some prior art implementations. A common mode feedback circuit comprised of amplifier 280 and reference voltage source 285 sets the voltage at the collector of transistors 245 and 255 to a level that prevents transistors 245 and 255 from entering the saturation region.

Figure 4:
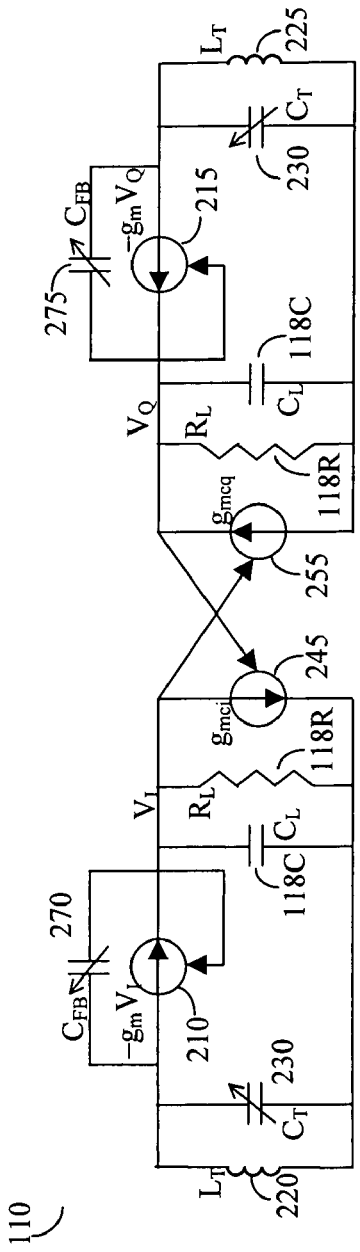
FIG. 4 is a diagram of the quadrature oscillator model.

For the linear oscillation model of FIG. 4, the frequency of oscillation is:

$$f_{OSC} = \frac{1}{2\pi\sqrt{LC_{total}}}$$

The value of $C_{total}$ can be easily calculated as:

$$C_{total} = \frac{C_{fb}C_L}{C_{fb}+C_L} + C_T$$

Where $C_{fb}$ is capacitor 270, $C_L$ is capacitor 118C, and $C_T$ is the value of the connected capacitors from capacitor bank 230 (see also FIG. 3). A typical value for $C_{fb}$ is 350 fF for 5 GHz operation. It is further noteworthy that in order to ensure oscillation, the resistor $R_L$ 118R value should be as follows:

$$R_L = \frac{C_L}{C_{fb}}g_m$$

Where $g_m$ is the transconductance amplification of, for example, transistor 210, noting that it is identical to that of transistor 215 due to the design considerations mentioned above. Larger or lower load resistor values will result in an increased or decreased oscillation voltage envelope, respectively.

Now referring back to FIG. 1, it will be noted that the quadrature VCO 100 consists of two modified differential common base Colpitts LC oscillators 114 that are cross coupled to each other through a cross-coupler 120. To achieve the coupling between oscillators 114, as shown in FIG. 3, there are further provided circuit 114 having inputs 1142 and 1141 to transconductors 240 and 250 respectively, and outputs 1143 and 1144, respectively. Outputs 1143 and 1144 of first oscillator 110-A are connected to inputs 1141 and 1142 of oscillator 110-B respectively. Outputs 1143 and 1144 of second oscillator 110-B are connected to inputs 1142 and 1141 of oscillator 110-A respectively, thereby achieving the forcing of the two oscillators of the system to oscillate in quadrature.

The oscillation of the quadrature oscillator 100 is described from a linear model of the circuit of FIG. 3. In particular, the analysis is based on the model of circuit 114 shown in FIG. 4. It can be shown that:

$$\omega_{quad} = \frac{d}{2\lambda} + \sqrt{\frac{d^2}{4\lambda^2} + \omega_0^2}$$

$$d = g_m/g_{mcq} = g_m/g_{mci}$$

$$\omega_0 = \frac{1}{\sqrt{L_T C_{FB}}}, \quad \lambda = g_m L_T$$

A person skilled in the art would note that the advantage of this circuit is that the effect of changes in the load capacitor $C_L$ 116C only slightly affects the oscillation frequency. The result is that the oscillation frequency of the disclosed quadrature oscillator 100 is essentially immune to load variations. The oscillation frequency can be further designed to be different from the tank resonance ($\omega_0$) since it depends on the factor d/λ in order to avoid unwanted coupling at the oscillation frequency from other sources, or from the oscillator quadrature tanks. A person skilled in the art would further note that the capacitor bank 230 may be implemented using a metal oxide semiconductor (MOS) capacitor bank, allowing tuning of the frequencies in multiple, for example, to sixteen discrete frequencies. Fine tuning can then be achieved by tuning the varactor capacitance 270 and 275. The quadrature VCO 100 current is designed to be frequency dependent by controlling the voltage 265 to current source 260 (FIG. 3), such that the current is suitable for each one of the possible frequencies of oscillation of quadrature oscillator 100. If quadrature oscillator 100 is designed to support sixteen discrete frequencies, then it is necessary to have sixteen different settings for bias current control source 265 to address the needs of each of these frequencies. Specifically, the oscillator loop gain is smaller at lower frequencies, since the $C_{fb}$ 270 and 275, which are the feedback capacitors responsible for the loop gain, vary in a small range only for fine tuning purposes. In order to overcome the effects of the lower gain at lower frequencies and the higher gains at the higher frequencies, the oscillator bias current may be varied inversely proportional to the frequency of oscillation. Moreover, as in quadrature VCO 100 (FIG. 1), a difference in gm of the coupling transconductors 240 and 250 (FIG. 3) can cause a phase shift error at the quadrature output. For compensation of this effect, the two oscillators 110-A and 110-B may be biased separately so that the phase at the output can be adjusted properly to calibrate for any phase shift mismatches.

Calibration currents may come from a phase-error detector that senses the quadrature signals before the point-of-use, for example at the receiver/transmitter limiters of each transceiver of a wireless system. It should be further noted that the transistor pair 240 and 250 and the transistor pair 245 and 255 can be biased separately in each oscillator by independent control of the emitter currents, as shall be subsequently described in greater detail. The transconductor pair 240 and 250 controls the phase coupling while the pair 245 and 255 controls the oscillation amplitude. By applying different bias conditions to the four pairs, phase-errors and amplitude imbalance of VCO 100 can be controlled.

Figure 5:
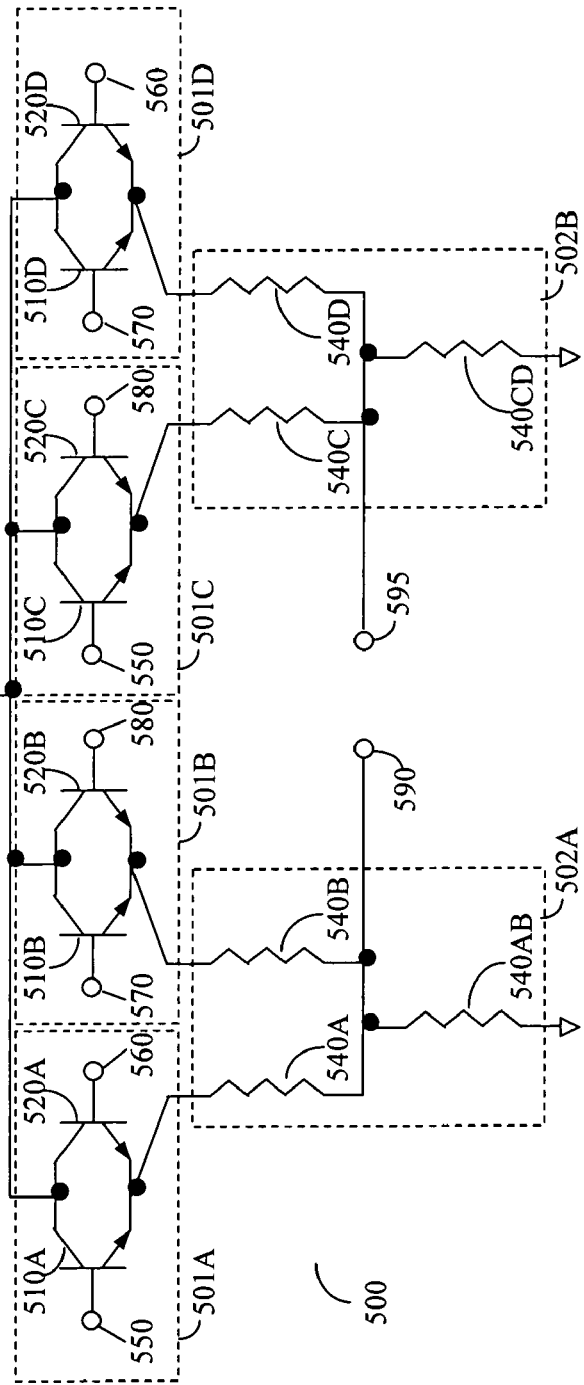
FIG. 5 is a diagram of a quadrature phase-error detector in accordance with the disclosed invention.

A basic phase-error detector (PED) in accordance with an embodiment of the disclosed invention is shown in FIG. 5. Four signals are received from quadrature VCO 100 (FIG. 1), two from the outputs of oscillator 110-A and two from oscillator 110-B. The first pair of signals are IP and IN signals and the second pair are QP and QN signals. The signals IP, QP, IN, and QN are time spaced a quarter of a cycle apart from each other, or in other words, T/4 seconds apart, where T is the period of the RF signal generated by quadrature VCO 100. PED 500 is comprised of four pairs 501 of common emitter transistors 510 and 520, for example, transistors 510A and 520A. Each two pairs of transistors are further connected by resistors, for example the pairs 510-A/520A (501A) and 510-B/520B (501B) are connected via resistors 540A and 540B, which in turn are connected to resistor 540AB. The base of each of the transistors 510 and 520 is used for the connection of one of the four signals mentioned above. It should be noted that this connection should take place at close proximity to the point-of-use of these signals as this will ensure that the phase-error is detected where it disturbs the most. A person skilled in the art would note that this circuit is an analog equivalent to performing the equivalent logic operation:

$Y=(IP+QP)\oplus(IN+QN)$ $Z=(IP+QN)\oplus(IN+QP)$ where IP is connected to nodes 550, QP to nodes 560, IN to nodes 570, and QN to nodes 580. Hence, the bipolar pairs, for example the pair 510A and 520A (501A), act as OR gates (501) with the bases acting as inputs and the common emitter nodes as outputs. The common emitter node voltages are converted to currents through the resistors, for example resistors 540A and 540B, and the currents are summed, for example into resistor 540AB, in order to obtain the Y and Z functions on nodes 590 and 595, comprising circuit 502A, respectively. When the signals are in quadrature, the Y output 590 and the Z output 595 are symmetrical, having a duty cycle of fifty percent. A relative phase mismatch between the quadrature signals will cause the signals to space apart causing Y and Z of 590 and 595, respectively, to cease having a duty cycle of fifty percent, one increasing and the other decreasing, dependent on the direction of the phase shift. The result is a differential current which can be integrated and to provide a metric for the quadrature phase mismatch.

In a differential implementation of a PED 600, as shown in FIG. 6, and the respective currents further detailed in a table shown in FIG. 7, where $V_T$=KT/q, and $V_1$ and $V_2$ are signals at quadrature from each other, for example a sine and cosine signals. The integrated phase-error at the output of the detector is:

$$PED(t) = \int_0^T [I_{QaQbY} + I_{QeQfY} + I_{QcY} + I_{QdY} - (I_{QaQbZ} + I_{QeQfZ} + I_{QcZ} + I_{QdZ})]dt$$

where the currents refer to the collector currents of an essentially equivalent differential implementation. A paramount advantage of a PED over prior art solutions is that it does not depend on an external, usually digital step, which limits the accuracy to the size of the step, nor does it use one of the signals as a reference signal and then use arcsine functions, which tend to suffer from inaccurate implementations or a high level of complexity.

Figure 8:
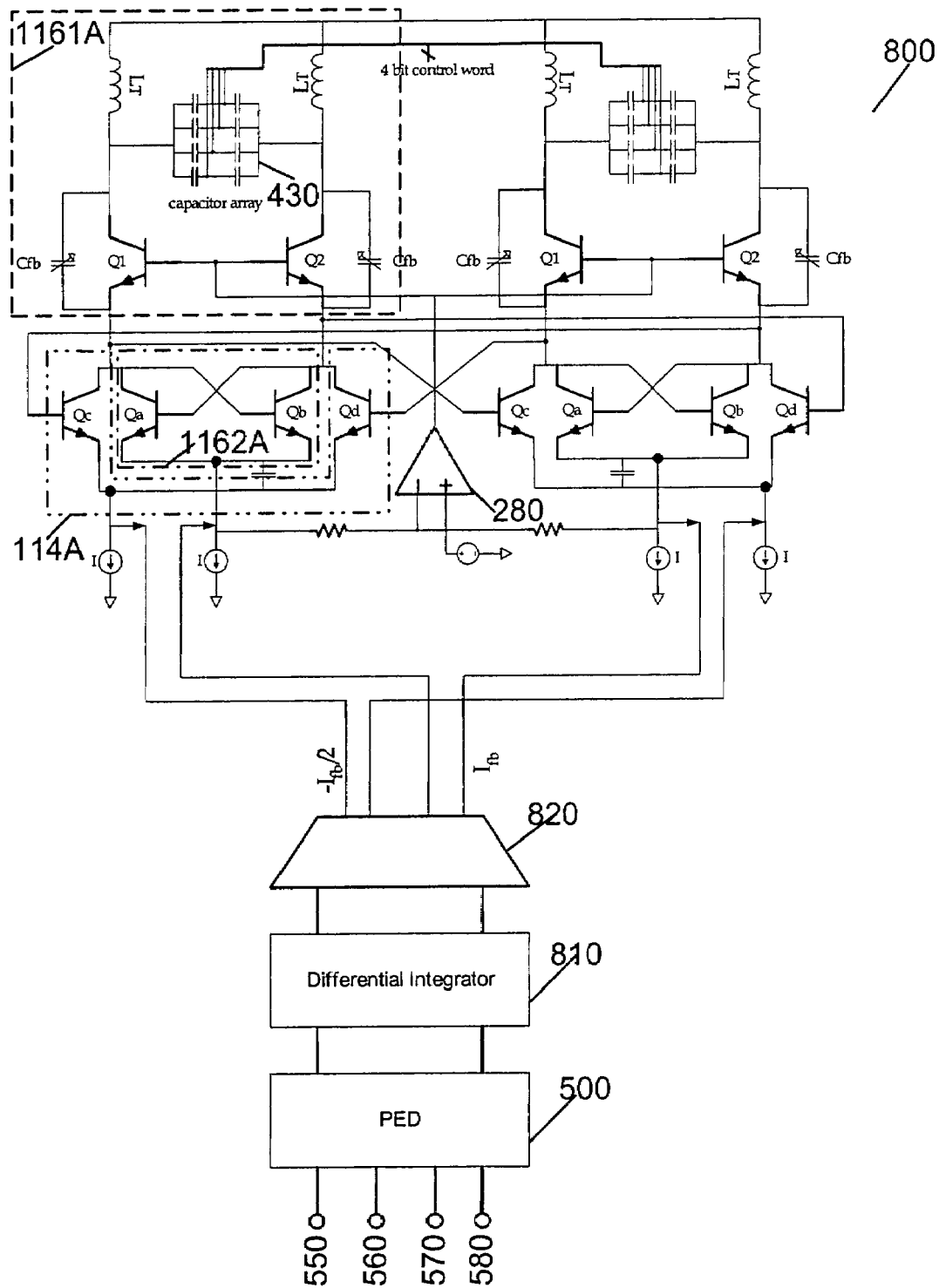
FIG. 8 is a schematic diagram of the connection of the quadrature phase-error detector and the modified quadrature VCO.
Figure 9:
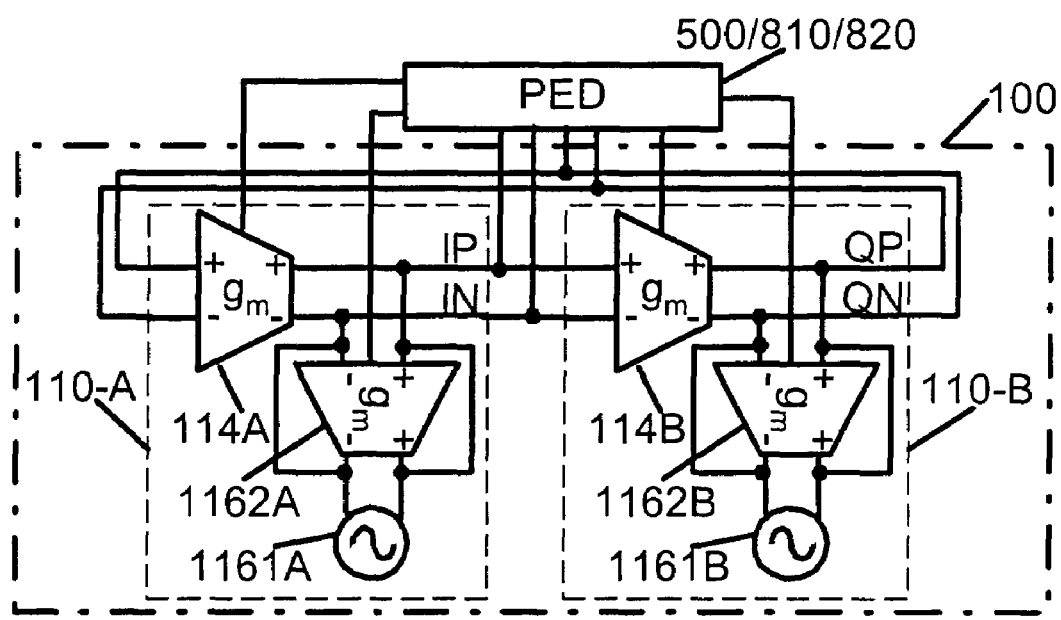
FIG. 9 is a schematic block diagram of the quadrature VCO.

Reference is now made to FIG. 8 where an exemplary schematic diagram 800 of the connection of the quadrature PED 500 and the modified quadrature VCO is shown. The VCO portion is comprised of two modified differential Colpitts oscillators, each comprising for example, circuit 1162A, an oscillation enabling circuit 1161A and a quadrature circuit 114A. Operating in unison, these circuits ensure the oscillation of the two oscillators of the VCO in quadrature. Effectively, for the purpose of the phase-error correction, there is a split of the bias current into two current sources, one for circuit 1161A and the other for circuit 114A, each being affected by the circuitry of PED, for example PED 500. PED 500 detects the phase-error, differential integrator 810 performs an integration of the currents over time, and transconducting amplifiers 820 enables the control of the currents of circuits 1162A and 114A, thereby forcing the necessary phase correction of the overall circuit. The overall operation of the quadrature VCO 100, with phase-error correction circuitry, is shown schematically in the simplified diagram of FIG. 9. It should be noted that the inputs IP, IN, QP and QN into the phase-error correction circuitry should be taken from a point in the circuit as close as possible to the point-of-use, as explained above.

While certain preferred embodiments of the present invention have been disclosed and described herein, it will be understood by those skilled in the art that various changes in form and detail may be made therein without departing from the spirit and scope of the invention. Similarly, the various aspects of the present invention may be advantageously practiced by incorporating all features or various sub-combinations of features as desired. A person skilled in the art may implement the disclosed invention in technologies such as bipolar, BiCMOS, CMOS and the like without departing from the spirit of the disclosed invention.

What is claimed is:

1. A quadrature oscillator circuit for generating in phase and quadrature signals comprising:
    a first differential oscillator having a differential input and a differential output;
    a second differential oscillator having a differential input and a differential output, the first and second differential oscillators being alike;
    the differential output of said first differential oscillator being connected to the differential input of said second differential oscillator;
    the differential output of said second differential oscillator being connected in a cross-coupled manner to said differential input of said first differential oscillator;
    whereby the differential output of said first differential oscillator will be ninety degrees from the differential output of said second differential oscillator, and each of said first and second differential oscillators comprises:
    a differential Colpitts oscillator connected in a common base mode and adapted to be coupled to another differential Colpitts oscillator, the differential Colpitts oscillator and coupled to a capacitor bank enabling discrete selection of a resonant frequency by connecting or disconnecting a plurality of capacitors from the capacitor bank to the differential Colpitts oscillator;
    a first differential transconducting amplifier coupled to said differential Colpitts oscillator for accelerating oscillation of said differential Colpitts oscillator;
    a second differential transconducting amplifier coupled to said differential Colpitts oscillator for connecting the differential input of said differential oscillator to the differential output of said other differential oscillator; and,
    a current source coupled to said first differential transconducting amplifier to supply a bias current for said differential Colpitts oscillator.

2. The quadrature oscillator circuit of claim 1 wherein each of said differential Colpitts oscillators further comprises a common mode feedback circuit enabled to bias the common base of the differential Colpitts oscillator.

3. The quadrature oscillator circuit of claim 1 wherein fine tuning of the oscillation frequency of said differential Colpitts oscillator is performed by tuning capacitors connected to each of said differential Colpitts oscillators.

4. The quadrature oscillator circuit of claim 3 wherein at least one of said tuning capacitors is a voltage controlled capacitor.

5. The quadrature oscillator of claim 1 wherein said current source is variable to accommodate variations in loop gain with resonant frequency.

6. The quadrature oscillator of claim 2 wherein each common mode feedback circuit biases a differential transconducting amplifier of a respective differential Colpitts oscillator to prevent the differential transconducting amplifier from going into saturation.

7. A quadrature oscillator circuit for generating in phase and quadrature signals comprising:
    a first differential oscillator having a differential input and a differential output;
    a second differential oscillator having a differential input and a differential output, the first and second differential oscillators being alike;
    the differential output of said first differential oscillator being connected to the differential input of said second differential oscillator;
    the differential output of said second differential oscillator being connected in a cross-coupled manner to said differential input of said first differential oscillator;
    whereby the differential output of said first differential oscillator will be ninety degrees from the differential output of said second differential oscillator; and
    a phase error detector (PHD) coupled to the outputs of said first and said second differential osciliators, the PED configured to provide feedback currents to said first and said second differential oscillators for adjusting phases generated by said first differential oscillator and said second differential oscillator.

8. The quadrature oscillator circuit of claim 7 wherein said PED comprises:
    a first analog OR gate having an input for receiving a positive in-phase (T) signal and a positive quadrature-phase ('Q') signal;
    a second analog OR gate having an input for receiving a negative T signal and a negative 'Q'signal;
    first circuitry for summing the output from said first analog OR gate and said second analog OR gate to generate a first circuitry output;
    a third analog OR gate having an input for receiving a positive T signal and a negative 'Q' signal;
    a fourth analog OR gate having a first input for receiving a negative T signal and a positive 'Q' signal; and,
    second circuitry for summing the output from said third analog OR gate and said fourth analog OR gate and there from generating a second circuitry output;
    whereby the difference between said first circuitry output and said second circuitry output is a signal proportional to a phase error between the T signal and the 'Q' signal of the quadrature signal.

9. The quadrature oscillator circuit of claim 8 wherein said PED further comprises a differential integrator coupled to said first circuitry output and said second circuitry output.

10. A quadrature voltage controlled oscillator circuit for generating in phase and quadrature signals comprising:
    a first differential oscillator having a differential input and a differential output;
    a second differential oscillator having a differential input and a differential output, the first and second differential oscillators being alike;
    the differential output of said first differential oscillator being connected to the differential input of said second differential oscillator;
    the differential output of said second differential oscillator being connected in a cross-coupled manner to said differential input of said first differential oscillator;
    whereby the differential output of said first differential oscillator will be ninety degrees from the differential output of said second differential oscillator;
    each differential oscillator having a capacitor bank enabling a discrete selection of a resonant frequency from a plurality of frequencies;

the first differential oscillator and the second differential oscillator circuit each having a voltage controlled tuning capacitor for fine tuning of the resonant frequency;

each of said first and second differential oscillators comprises:
a differential Colpitts oscillator connected in a common base mode and coupled to the capacitor bank;
a first differential transconducting amplifier coupled to said differential Colpitts oscillator for accelerating oscillation of said differential Colpitts oscillator;
a second differential transconducting amplifier coupled to said differential Colpitts oscillator for connecting the differential input of said differential oscillator to the differential output of said other differential oscillator; and,
a current source coupled to said first differential transconducting amplifier to supply a bias current for said differential Colpitts oscillator.

11. The quadrature voltage controlled oscillator circuit of claim 10 wherein each of said differential Colpitts oscillators further comprises a common mode feedback circuit enabled to bias the common base of the differential Colpitts oscillator.

12. The quadrature voltage controlled oscillator of claim 10 wherein said current source is variable to accommodate variations in loop gain with resonant frequency.

13. The quadrature voltage controlled oscillator of claim 11 wherein each common mode feedback circuit biases a differential transconducting amplifier of a respective differential Colpitts oscillator to prevent the differential transconducting amplifier from going into saturation.

14. A quadrature voltage controlled oscillator circuit for generating in phase and quadrature signals comprising:
a first differential oscillator having a differential input and a differential output;
a second differential oscillator having a differential input and a differential output, the first and second differential oscillators being alike;
the differential output of said first differential oscillator being connected to the differential input of said second differential oscillator;
the differential output of said second differential oscillator being connected in a cross-coupled manner to said differential input of said first differential oscillator;
whereby the differential output of said first differential oscillator will be ninety degrees from the differential output of said second differential oscillator;
each differential oscillator having a capacitor bank enabling a discrete selection of a resonant frequency from a plurality of frequencies;
the first differential oscillator and the second differential oscillator circuit each having a voltage controlled tuning capacitor for fine tuning of the resonant frequency; and
a phase error detector (PED) coupled to the outputs of said first and said second differential oscillators, the PED configured to provide currents to said first and said second differential oscillators for adjusting phases generated by said first differential oscillator and said second differential oscillator.

15. The quadrature voltage controlled oscillator circuit of claim 14 wherein said PED comprises:
a first analog OR gate having an input for receiving a positive in-phase (T) signal and a positive quadrature-phase ('Q') signal;
a second analog OR gate having an input for receiving a negative T signal and a negative 'Q' signal;
first circuitry for summing the output from said first analog OR gate and said second analog OR gate to generate a first circuitry output;
a third analog OR gate having an input for receiving a positive T signal and a negative 'Q' signal;
a fourth analog OR gate having a first input for receiving a negative T signal and a positive 'Q' signal; and,
second circuitry for summing the output from said third analog OR gate and said fourth analog OR gate and there from generating a second circuitry output;
whereby the difference between said first circuitry output and said second circuitry output is a signal proportional to a phase error between the T signal and the 'Q' signal of the quadrature signal.

16. The quadrature voltage controlled oscillator circuit of claim 15 wherein said PED further comprises a differential integrator coupled to said first circuitry output and said second circuitry output.

* * * * *

UNITED STATES PATENT AND TRADEMARK OFFICE
CERTIFICATE OF CORRECTION

PATENT NO.        : 7,075,377 B2
APPLICATION NO. : 10/864969
DATED              : July 11, 2006
INVENTOR(S)      : Emmanuel Metaxakis It is certified that error appears in the above-identified patent and that said Letters Patent is hereby corrected as shown below:

In Item [73], Assignee, please delete "Microeletronics" and insert -- Microelectronics --.

In Claim #1, Line #21, please delete "and".

In Claim #7, Line #17, please delete "(PHD)" and insert -- (PED) --.

In Claim #7, Line #18, please delete "osciliators" and insert -- oscilators --.

In Claim #8, Line #4, please delete "(T)" and insert -- ("I") --.

In Claim #8, Line #7, please delete "(T)" and insert -- ("I") --.

In Claim #8, Line #12, please delete "(T)" and insert -- ("I") --.

In Claim #8, Line #14, please delete "(T)" and insert -- ("I") --.

In Claim #8, Line #20, please delete "(T)" and Insert -- ("I") --.

In Claim #14, Line #26, after "provide" please insert -- feedback --.

In Claim #15, Line #4 please delete "(T)" and insert -- ("I") --.

In Claim #15, Line #7 please delete "(T)" and insert -- ("I") --.

In Claim #15, Line #12 please delete "(T)" and insert -- ("I") --.

UNITED STATES PATENT AND TRADEMARK OFFICE
CERTIFICATE OF CORRECTION

PATENT NO. : 7,075,377 B2
APPLICATION NO. : 10/864969
DATED : July 11, 2006
INVENTOR(S) : Emmanuel Metaxakis It is certified that error appears in the above-identified patent and that said Letters Patent is hereby corrected as shown below:

In Claim #15, Line #14 please delete "(T)" and insert -- ("I") --.

In Claim #15, Line #20 please delete "(T)" and insert -- ("I") --.

Signed and Sealed this

Twentieth Day of March, 2007

JON W. DUDAS
*Director of the United States Patent and Trademark Office*